United States Patent
Liu et al.

(10) Patent No.: US 11,201,604 B1
(45) Date of Patent: Dec. 14, 2021

(54) RESAMPLING ALGORITHM BASED ON WINDOW FUNCTION

(71) Applicant: NORTH CHINA ELECTRIC POWER UNIVERSITY, Beijing (CN)

(72) Inventors: Hao Liu, Beijing (CN); Tianshu Bi, Beijing (CN); Jie Lin, Beijing (CN); Sudi Xu, Beijing (CN); Yongzhao Lao, Beijing (CN)

(73) Assignee: North China Power Electric University, Beijing (CN)

( * ) Notice: Subject to any disclaimer, the term of this patent is extended or adjusted under 35 U.S.C. 154(b) by 0 days.

(21) Appl. No.: 17/215,945

(22) Filed: Mar. 29, 2021

Related U.S. Application Data

(63) Continuation of application No. PCT/CN2021/077673, filed on Feb. 24, 2021.

(51) Int. Cl.
| | | |
|---|---|---|
| *H03H 17/00* | (2006.01) | |
| *H03H 17/02* | (2006.01) | |
| *H03H 17/06* | (2006.01) | |
| *G06F 17/17* | (2006.01) | |

(52) U.S. Cl.
CPC ......... *H03H 17/0027* (2013.01); *G06F 17/17* (2013.01); *H03H 17/028* (2013.01); *H03H 17/0642* (2013.01)

(58) Field of Classification Search
CPC .............. H03H 17/0027; H03H 17/028; H03H 17/0642
See application file for complete search history.

(56) References Cited

U.S. PATENT DOCUMENTS

| | | | | |
|---|---|---|---|---|
| 7,203,718 B1* | 4/2007 | Fu | .......................... | G06F 7/5446 708/622 |
| 2013/0187694 A1* | 7/2013 | Joung | ................ | H03H 17/0642 327/159 |
| 2021/0111707 A1* | 4/2021 | Paquelet | ................. | G06F 17/17 |

OTHER PUBLICATIONS

Liu et al.,"A Resampling Method Based on Filter Designed by Window Function Considering Frequency Aliasing", IEEE, pp. 1018-5030. (Year: 2020).*

* cited by examiner

*Primary Examiner* — Chuong D Ngo
(74) *Attorney, Agent, or Firm* — Hunton AK, LLP

(57) ABSTRACT

A resampling method based on window function for flexible sampling rate conversion in broadband frequency measurement devices is described. The resampling algorithm can satisfy the requirements of different sampling rates. The frequency responses of the filter in the resampling model based on the Farrow structure are analyzed, and the design criterion of the filter in resampling model is considered. A fractional delay filter design model based on window function method is described. A fractional delay filter matrix, which is expressed by polynomial form, is constructed. Then the expression related to subfilter coefficients is obtained and subfilter coefficients are solved for by the least square method.

1 Claim, 10 Drawing Sheets

RESAMPLING ALGORITHM BASED ON WINDOW FUNCTION

BACKGROUND

Resampling technology is becoming increasingly critical, as different frequency components are required to be measured in one device.

SUMMARY

A resampling algorithm based on window function method is described which can satisfy the requirements of different sampling rates. The frequency responses of the filter in the resampling model based on the Farrow structure are analyzed, and the design criterion of the filter in resampling model is considered. A fractional delay filter design model based on window function method is described. A fractional delay filter matrix, which is expressed by polynomial form, is constructed. Then the expression related to subfilter coefficients is obtained and subfilter coefficients are solved for by the least square method. The simulation results reveal that the presented method can flexibly adjust the frequency responses of the filter compared with the existing design methods, ensuring that frequency aliasing does not occur during resampling. The presented model can design the expected filter, the frequency responses of which change with the sampling rate and the delay. Therefore, the presented algorithm meets the conditions for application to existing measurement devices.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
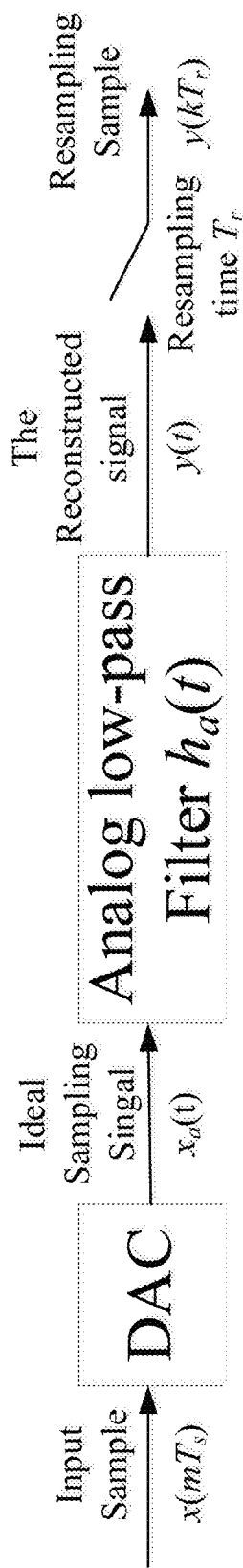
FIG. 1 shows a flowchart for arbitrary sampling rate conversion.

Exemplary embodiments of the invention will now be described in order to illustrate various features of the invention. The embodiments described herein are not intended to be limiting as to the scope of the invention, but rather are intended to provide examples of the components, use, and operation of the invention.

I. Introduction

With the increasing development of renewables and DC transmission, a large number of electronic devices are applied to power systems, which complicate the calculation of the electrical quantity. Therefore, the measurement devices are required to monitor the components within a wide frequency bandwidth, instead of just the fundamental one, such as the broadband frequency measurement devices in China and the Universal Grid Analyzer in the United States. Taking the broadband frequency measurement device as an example, besides the fundamental component, it needs to measure harmonics up to $50^{th}$ order and inter-harmonics from 0 to 300 Hz.

To measure the signals distributed within such a wide range, it is necessary to use different sampling frequencies for the calculation of different frequency components to decrease the computational burden. Therefore, the resampling process after the original sampling is critical. The resampling algorithm applied in the measurement devices requires the function of arbitrary sampling rate conversion and the prevention of frequency aliasing. In recent decades, certain resampling technologies have been widely used in radio, audio, digital signal processing, asynchronous sampling, and frequency estimation, among others.

The existing methods for the implementation of resampling algorithms can be categorized into three types. The first is a direct method of decimation, interpolation and combination, the second is based on a polyphase filter structure, and the third is based on polynomial interpolation. The first method is simple. However, once the sampling rate is changed, the filter needs to be redesigned; therefore, this method has poor flexibility. The second method uses a polyphase filter-bank to achieve synchronization and interpolation. The polyphase filter structure needs to design multiple different filter units to achieve the parallel filtering function. Compared with the first method, it can realize arbitrary rational sampling rate conversion; however, it requires multiple filter units, which creates a large calculational burden.

The principle of the third type of method is to implement interpolation via polynomial function, which can be further divided into Lagrange polynomials, spline interpolation polynomials and methods based on Farrow structure. The filters designed based on the Lagrange and spline interpolation polynomials have stable magnitude responses in the low-frequency band, but poor magnitude responses in the high-frequency band; thus, the performance of these filters is not great. An interpolation filter has been proposed, the impulse response of which is composed of a piecewise polynomial form that has good flexibility. When resampling by this method, the Farrow structure subfilter coefficients do not need to be changed, and the interpolation filter coefficients can be calculated according to different fractional delay parameters. This method can achieve efficient calculation and arbitrary sampling rate conversion, and has low calculational burden.

The key to design the Farrow structure interpolation filter is the determination of the subfilter coefficients. The existing coefficients design methods include weighted least squares (WLS), minimax methods, and intelligent algorithms. Among them, intelligent algorithms represented by particle swarm optimization (PSO) are only applicable to the cases of low-dimension coefficients; when the dimension of coefficients is high, the algorithm cannot be further optimized. The minimax method and WLS method are both designed to minimize the design error. During the design process, the matrix inversion and integration operations increase the calculation complexity, resulting in a long design time and the complicated adjustment of weight parameters. In addition, a matrix-based conjugate gradient (CG) algorithm has been considered, and this method can effectively solve the problems of large amounts of calculation and weight adjustment in optimal algorithms. However, the focus of these methods is on the design of the filter in the passband range, and they do not consider the transition band or stopband. Therefore, whether the performance of the filters designed by these methods can meet the actual requirements needs to be further investigated.

In this disclosure, a resampling algorithm based on window function is described, which can realize arbitrary sampling rate conversion and adjust the filter characteristics according to the demand. According to the resampling model based on Farrow structure, the change principles of the filter characteristics are investigated, namely the larger the filter order, the shorter the frequency band in the spectrum, and the design criterion that requires the stopband cutoff frequency of the filter in the resampling model less than $\pi$ is described. Then a method based on window function is described to obtain multiple fractional delay filter coefficients, subfilter coefficients matrix is solved by least square method, and the characteristics of window spectrum are described. Simulation results show that resampling based on the presented method can achieve arbitrary sampling rate conversion, and resampling satisfies the Nyquist theorem.

II. Characteristic Analysis of Resampling Based on Farrow Structure

A. Principle of Resampling Based on Farrow Structure

The process of arbitrary sampling rate conversion can be viewed as first reconstructing the original signal with the sampling points, then resampling the reconstructed signal at the required time and sampling rate. FIG. 1 shows a flowchart for arbitrary sampling rate conversion.

The expression of resampling sample $y(kT_r)$ is $$y(kT_r) = \sum_{m=-\infty}^{\infty} x(mT_s) h_a(kT_r - mT_s), \tag{1}$$

where k is the number of resampling sequence, $T_r$ is the resampling cycle, m is the number of sampling sequence, $T_s$ is the sampling cycle, $x(mT_s)$ is the sampling sequence, $h_a(t)$ is the impulse response of the ideal analog low-pass filter, and $h_a(kT_r-mT_s)$ represents the sample of $h_a(t)$. Hence, the resampling result (1) can be considered the convolution of $x(mT_s)$ with the impulse response $h_d(m)$ of digital filter.

To ensure that frequency aliasing does not occur during resampling, the frequency responses $H_d(\omega)$ of the digital filter $h_d(m)$ should be $$H_d(\omega) = \begin{cases} 1, & |\omega| < f_r/2, \\ 0, & |\omega| \geq f_r/2, \end{cases} \tag{2}$$

where $\omega$ is the normalized angular frequency and $f_r$ is the resampling frequency. However, it is impossible to realize the impulse response $h_a(t)$ of the ideal analog low-pass filter in practical applications.

Simple piecewise polynomials are generally used instead of the impulse response $h_a(t)$. Given the degree I of the polynomial and the length $\Delta$, $h_a(t)$ can be divided into equal-length piecewise polynomials $$h_a(t) = \sum_{n=0}^{N-1} a_n(t - n\Delta), 0 \leq t \leq N\Delta, \tag{3}$$

where N is the number of polynomials and $a_n(t)$ is the n-th segment polynomial. $a_n(t)$ is expressed as $$a_n(t) = \begin{cases} \sum_{i=0}^{I} c(n, i)\left(\frac{t}{\Delta} - 0.5\right)^i, & 0 \leq t \leq \Delta, \\ 0, & \text{else } t, \end{cases} \tag{4}$$

where c(n,i) is the i-th coefficient of the n-th segment polynomial, and $t/\Delta-0.5$ is the polynomial variable with a range of [−0.5, 0.5]. After taking n=[t/$\Delta$], and substituting (4) into (3), $$h_a(t) = \sum_{i=0}^{I} c\left(\left[\frac{t}{\Delta}\right], i\right)\left(\frac{t}{\Delta} - \left[\frac{t}{\Delta}\right] - 0.5\right)^i, 0 \leq t \leq N\Delta, \tag{5}$$

where [•] indicates the largest integer not exceeding (•). Equation (5) is the expression of replacing $h_a(t)$ with piecewise polynomials.

After substituting (5) into (1) and taking $\Delta=T_s$, the expression becomes $$y(kT_r) = \sum_{m=-\infty}^{\infty} \sum_{i=0}^{I} x(mT_s) c\left(\left[\frac{kT_r - mT_s}{T_s}\right], i\right)\left(\frac{kT_r}{T_s} - \left[\frac{kT_r}{T_s}\right] - 0.5\right)^i \tag{6}$$

$$= \sum_{m=-\infty}^{\infty} \sum_{i=0}^{I} x(mT_s) c\left(\left[\frac{kT_r - mT_s}{T_s}\right], i\right)(p_k)^i,$$

where $p_k$ is the delay between the input sample and the output sample. As $p_k$ has nothing to do with m, (6) can be simplified to $$y(kT_r) = \sum_{i=0}^{I} \tilde{x}_i(mT_r)(p_k)^i, \tag{7}$$

where $\tilde{x}_i(mT_r)$ is the representation of the sum of $x(mT_s)$ and $c([kT_r-mT_s]/T_s,i])$. Equation (7) can be implemented by the Farrow structure.

After substituting (5) into (1) and taking $\Delta=T_r$, the expression becomes $$y(kT_r) = \sum_{m=-\infty}^{\infty} \sum_{i=0}^{I} x(mT_s) c\left(\left[\frac{kT_r - mT_s}{T_r}\right], i\right)\left(-\frac{mT_s}{T_r} - \left[-\frac{mT_s}{T_r}\right] - 0.5\right)^i \tag{8}$$

$$= \sum_{m=-\infty}^{\infty} \sum_{i=0}^{I} x(mT_s) c\left(\left[\frac{kT_r - mT_s}{T_s}\right], i\right)(p_m)^i.$$

As $p_m$ is associated with m, (8) can be simplified to $$y(kT_r) = \sum_{m=-\infty}^{\infty} \sum_{i=0}^{I} \tilde{x}_i(mT_s) c\left(\left[\frac{kT_r - mT_s}{T_r}\right], i\right), \tag{9}$$

where $\tilde{x}_i(mT_s)$ is the representation of the sum of $x(mT_s)$ and $p_m^i$. Equation (9) can be implemented by the Transposed Farrow structure. Equations (6) and (8) can both be denoted as the resampling model based on Farrow structure. Because the segment length is different, the filter in (6) has better de-mirror properties, and (6) is suitable for interpolation. The filter in (8) has relatively better de-aliasing properties, and (8) is suitable for decimation. In Farrow structure, c(n,i) are called the subfilter coefficients.

Because there are delay variables $p_k$ and $p_m$ in (6) and (8), the group delay responses of the filter in the resampling model can be changed with adjustable delay.

In resampling models (6) and (8), the key is to determine the subfilter coefficients c(n,i). Additionally, to ensure that resampling meets the Nyquist theorem, the digital filtering fitted by c(n,i) is required to filter out signals above $f_r/2$.

B. Frequency Responses Analysis of the Filter in Resampling Model

Because the resampling model must have the function of arbitrary sampling rate conversion, the frequency responses of the filter in the model should change with the resampling frequency $f_r$ as shown in (2).

Because (3) specifies the range of t in $h_a(t)$, the range of m in (1) is specified correspondingly as $$0 \le kT_r - mT_s \le N\Delta, \tag{10}$$

and the following can be obtained:

$$\frac{kT_r - N\Delta}{T_s} \le m \le \frac{kT_r}{T_s}. \tag{11}$$

As m is an integer, the order K of the digital filter is determined as $$K = [N\Delta/T_s] - 1. \tag{12}$$

When $\Delta = T_s$, K is a fixed value. Equation (6) is suitable for interpolation, that is, the case in which $T_s \ge T_r$. If the digital filter satisfies (2) when $T_s = T_r$, then resampling can satisfy the Nyquist theorem when $T_s > T_r$.

When $\Delta = T_r$, K varies with $T_r/T_s$. Equation (8) is suitable for decimation, that is, the case in which $T_s \le T_r$. If $T_s$ is specified as a fixed value, then the frequency responses of the filter need to change with $T_r$ to satisfy (2). Therefore, the frequency responses of the filter in (8) are analyzed as follows.

According to (5), $h_p(n)$ is defined as the impulse response of the digital filter corresponding to $h_a(t)$. $h_p(n)$ can be simply expressed as $$h_p(n) = \sum_{i=0}^{I} c(n, i) p^i, \quad -0.5 \le p \le 0.5. \tag{13}$$

Because the group delay responses of $h_p(h)$ vary with delay p, (13) represents the impulse response of variable fractional delay (VFD) filter. When p is fixed, $h_p(n)$ is the impulse response of a fractional delay (FD) filter.

Equation (1) shows that $h_p(h)$ can be regarded as the result of sampling $h_a(t)$. Take the sampling period as $T_1$, then $$h_p(n) = h_a(t)|_{t=nT_1}. \tag{14}$$

To determine the relationship between $h_p(n)$ and $h_a(t)$ in the frequency domain, an ideal sample signal $h_a'(t)$ is introduced. The expression of $h_a'(t)$ is $$h_a'(t) = \sum_{n=-\infty}^{\infty} h_a(t)\delta(t - nT_1), \tag{15}$$

where $\delta(t)$ is the impulse function. Take the Fourier transforms corresponding to $h_a(t)$, $h_p(n)$, and $h_a'(t)$ as $H_a(\Omega)$, $H_p(\omega)$ and $H_a'(\Omega)$, there are $$H_p(\omega) = \sum_{n=-\infty}^{\infty} h(n) e^{-j\omega n}, \tag{16}$$

and $$H_a'(\Omega) = \int_{-\infty}^{\infty} h_a'(t) e^{-j\Omega t} dt = \int_{-\infty}^{\infty} \sum_{n=-\infty}^{\infty} h_a'(t)\delta(t - nT_1) e^{-j\Omega t} dt = \tag{17}$$

$$\sum_{n=-\infty}^{\infty} h_a(nT_1) e^{-j\Omega T_1 n} = \sum_{n=-\infty}^{\infty} h_a(nT_1) e^{-j\omega n},$$

where $\Omega$ is the analog angular frequency, $\Omega = \omega T_1$. Therefore, the relationship between $H_p(\omega)$ and $H_a'(\Omega)$ is $$H_p(\omega) = H_a'(\Omega). \tag{18}$$

The relationship between $H_a'(\Omega)$ and $H_a(\Omega)$ is $$H_a'(\Omega) = \frac{1}{2\pi}[FT[h_a(t)] * FT[\delta(t - nT_1)]] = \frac{1}{T_1}\sum_{n=-\infty}^{\infty} H_a\left(\Omega - \frac{2\pi m}{T_1}\right), \tag{19}$$

where $FT[\cdot]$ is Fourier transform. By combining (18) and (19), the relationship between $H_p(\omega)$ and $H_a(\Omega)$ is obtained:

$$H_p(\omega) = H_a'(\Omega) = \frac{1}{T_1}\sum_{n=-\infty}^{\infty} H_a\left(\Omega - \frac{2\pi n}{T_1}\right) = \frac{1}{T_1}\sum_{n=-\infty}^{\infty} H_a\left(\frac{\omega - 2\pi n}{T_1}\right). \tag{20}$$

Equation (20) shows that $H_p(\omega)$ is obtained by expanding $H_a(\Omega)$ by $T_1$ times, multiplying it by $1/T_1$, and then shifting it by $2\pi n/T_1$.

To reflect the frequency domain characteristics of filters with different orders, another sampling period $T_2$ ($T_2 > T_1$) is used to sample $h_a(t)$ to obtain $h_p'(n')$. Its Fourier transform form is $H_p'(\omega')$. According to (20), the expression of $H_p'(\omega')$ is $$H_p'(\omega') = \frac{1}{T_2}\sum_{n'=-\infty}^{\infty} H_a\left(\Omega - \frac{2\pi n'}{T_2}\right) = \frac{1}{T_2}\sum_{n'=-\infty}^{\infty} H_a\left(\frac{\omega' - 2\pi n'}{T_2}\right). \tag{21}$$

where $\omega' = \Omega T_2$. By taking $D = T_2/T_1$, then $\omega' = D\omega$. By contrasting (20) and (21), it can be found that the larger the sampling period, the wider the frequency band.

Figure 2:
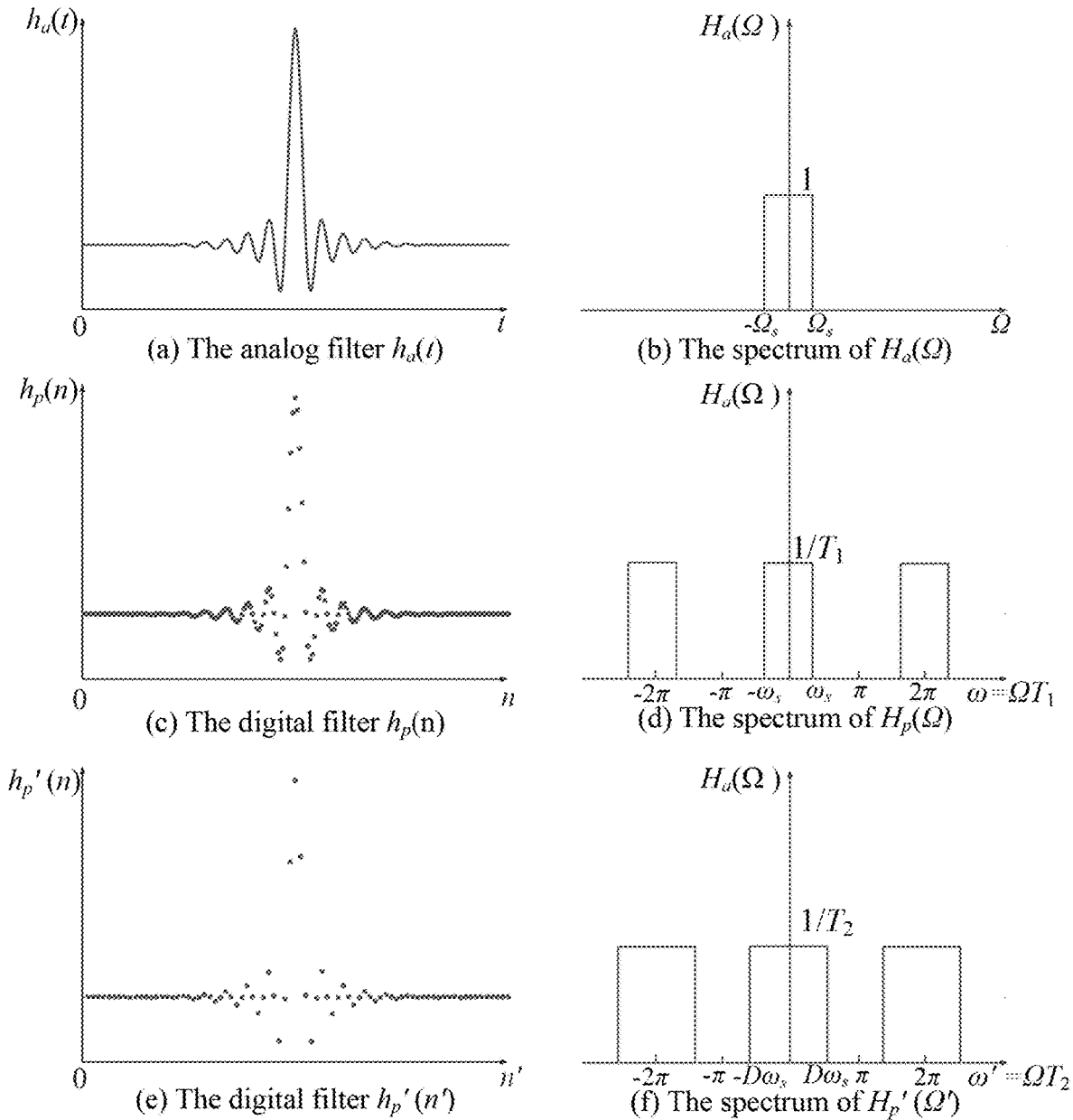
FIG. 2 shows exemplary results and spectrum of sampling from analog filters.

FIG. 2 shows exemplary results and spectrum of sampling from analog filters. In this example, diagrams of $h_a(t)$, $h_p(n)$, $h_p'(n')$ and $H_a(\Omega)$, $H_p(\omega)$, $H_p'(\omega')$ are displayed. FIG. 2 indicates that different resampling period $T_r$ further affect the frequency responses of the filter by affecting the filter order; the larger the filter order, the shorter the frequency band in the spectrum.

According to (20) and FIG. 2, $H_p(\omega)$ is obtained by expanding the spectrum of $H_a(\Omega)$ with a period of $2\pi$. After specifying that $T_s$ is fixed, when $T_s=T_r$, if the stopband cutoff frequency ($\omega_s$) of the digital filter is controlled at $\omega_s<\pi$, resampling satisfy the Nyquist theorem. Then for $T_r=DT_s$ (D>1), the Nyquist theorem requires $\omega_s<\pi/D$, and the cutoff frequency of the digital filter will be less than RID according to (21). Therefore, resampling can also satisfy the sampling theorem when $T_r=DT_s$.

Thus, the design criterion requires that in resampling models (6) and (8), the stopband cutoff frequency $\varphi_s$ of the filter should be $\omega_s<\pi$ when $T_s=T_r$, then for cases in which $T_r \neq T_s$, frequency aliasing does not occur in resampling. Therefore, for the determination of the subfilter coefficients c(n,i) in (6) and (8), only the situation in which $T_s=T_r$ needs to be considered.

III. Resampling Based on Window Function Design

The key to the resampling model is the solution of the subfilter coefficients. In this section, a method based on window function is described to design subfilter coefficients. To ensure the characteristics of the filter, the window function is then discussed.

A. The Solution of Subfilter Coefficients in Farrow Structure

The analysis in the previous section demonstrated that the design of the subfilter coefficients only needs to consider the case in which $T_s=T_r$ in the resampling model; therefore, the filter order is specified as N. The frequency response corresponding to $h_p(n)$ is $$H_p(\omega, p) = \sum_{n=0}^{N-1} h_p(n)e^{-j\omega n} = \sum_{n=0}^{N-1}\sum_{i=0}^{I} c(n,i)p^i e^{-j\omega n}. \quad (22)$$

According to the requirement of (2), the desired variable frequency response is $$H_d(\omega,p)=e^{-j\omega((N-1)/2+p)}, \omega\in[0,\pi\pi], \quad (23)$$

where $0<\alpha<1$, $[0, \alpha\pi]$ is the passband of the filter. The traditional methods for the design of the subfilter coefficients c(n,i) are taking c(n,i) as variable, and taking the difference between $H_p(\omega, p)$ and $H_d(\omega, p)$ as the objective function. The objective function is then optimized, and the coefficients are finally solved. Hence, the traditional methods only focus on the difference of the passband without considering the stopband, and there are defects in these methods.

Unlike traditional methods, subfilter coefficients are designed from the perspective of designing fractional delay filter in advance. In this disclosure, the window function method is used to design a fractional delay filter. The expression of designing the impulse response of the linear-phase FIR filter via window function method is $$h_l(n)=h_d(n)\cdot w(n), 0\le n\le N-1, \quad (24)$$

where w(n) is a sequence of the window function of length N, Kaiser window is selected in this disclosure, and $h_d(n)$ is the impulse response of the ideal low-pass digital filter. The expression of $h_d(n)$ is $$h_d(n) = \begin{cases} \dfrac{\sin[\omega_c(n-\tau)]}{\pi(n-\tau)}, & n \neq \tau, \\ \dfrac{\omega_c}{\pi}, & n=\tau, \end{cases} \quad (25)$$

where $\tau$ and $\omega_c$ are the group delay and the cutoff frequency of the ideal low-pass digital filter. The relationship between $\omega_c$, the passband cutoff frequency $\omega_p$ and the stopband cutoff frequency $\omega_s$ of the designed filter is $$\omega_c=(\omega_p+\omega_s)/2 \quad (26)$$

Thus, $\omega_c$ can indirectly determine cos. The group delay z of the filter obtained by (24) which can be considered a fractional delay filter without delay, is (N−1)/2. To determine the impulse response $h_p(n)$ of the fractional delay filter, the sequence n is shifted by −p. Equation (24) then becomes $$h_p(n)=h_d(n-p)\cdot w(n-p), 0\le n\le N-1. \quad (27)$$

Equation (27) can be seen as the group delay $\tau$ of $h_l(n)$ shifted by p. Therefore, the group delay of the obtained fractional delay filter is $\tau+p$, and $h_p(n)$ is the impulse response of a fractional delay filter with a delay of p. The fractional delay filter obtained by window function method can be regarded as a result in which the magnitude responses of the FIR linear phase filter are unchanged, but the group delay responses are shifted.

Because the fractional delay filter can be designed in advance, it is much easier to design the subfilter coefficients c(n,i). In the interval [−0.5,0.5], take multiple values as p as follows:

$$p=-0.5+b\delta \;\; -0.5\le p\le 0.5, \quad (28)$$

where $\delta$ is an interval and b is an integer. Substitute p into (27) to obtain multiple fractional delay filter coefficients. A fractional delay filter coefficients matrix can then be constructed:

$$\begin{bmatrix} h_{p1} \\ h_{p2} \\ \vdots \\ h_{pk} \end{bmatrix} = \begin{bmatrix} h_{p1}(0) & h_{p1}(1) & \cdots & h_{p1}(N-1) \\ h_{p2}(0) & h_{p2}(1) & \cdots & h_{p2}(N-1) \\ \vdots & & & \\ h_{pk}(0) & h_{pk}(1) & \cdots & h_{pk}(N-1) \end{bmatrix}, \quad (29)$$

where $h_{p_k}$ is the filter coefficients whose delay is $p_k$. $h_{p_k}=[h_{p_k}(0), h_{p_k}(1), \ldots, h_{p_k}(N-1)]$. By combining (29) and (13), the coefficients matrix can be expressed in polynomial form:

$$\begin{bmatrix} h_{p1} \\ h_{p2} \\ \vdots \\ h_{pk} \end{bmatrix} = \begin{bmatrix} p_1 & p_1^2 & \cdots & p_1^I \\ p_2 & p_2^2 & \cdots & p_2^I \\ \vdots & \vdots & & \vdots \\ p_k & p_k^2 & \cdots & p_k^I \end{bmatrix} \begin{bmatrix} c_{11} & c_{12} & \cdots & c_{1N} \\ c_{21} & c_{22} & \cdots & c_{1N} \\ \vdots & \vdots & & \vdots \\ c_{I1} & c_{I2} & \cdots & c_{IN} \end{bmatrix}. \quad (30)$$

Then (30) can be simply to be $$H=P\,\square\,C. \quad (31)$$

Equation (31) can then be used to solve C by least square method as follows:

$$C=(P^T P)^{-1}P^T H. \quad (32)$$

By substituting the transpose of the solution result CT into (6) or (8), the entire model can be completely established.

B. The Window Function Selection

Equation (27) shows that, during the process of designing $h_p(n)$, the window function $w(n)$ can be adjusted to change $h_p(n)$. The window function can determine the difference between (22) and (23), and adjust the stopband attenuation of the designed filter. Therefore, the anti-aliasing effect of the designed filter is affected by the window function.

Different window functions have different truncation effects. Taking the Hanning and Blackman window as an example, there will be a slightly large leakage factor when truncating; thus, it is difficult to ensure the passband stability of the designed filter. As Kaiser window can adjust its frequency responses by modifying its parameters, Kaiser window with strong adaptability for design is selected in this disclosure.

The expression of the Kaiser window in the time domain is $$w(n) = \frac{I_0\left(\beta\sqrt{1-\left(1-\frac{2n}{N-1}\right)^2}\right)}{I_0(\beta)}, \tag{33}$$

where $I_0(\bullet)$ is the zeroth-order modified Bessel function and $\beta$ is an optional parameter. $I_0(\bullet)$ can be computed as $$I_0(x) = \sum_{k=0}^{\infty}\left[\frac{1}{k!}\left(\frac{x}{2}\right)^k\right]^2, \tag{34}$$

This infinite series is usually approximated by the sum of the first 25 terms. In (33), the characteristics of Kaiser window are different for different $\beta$, and $\beta$ can be determined by the desired stopband attenuation $A_s$.

$$\beta = \begin{cases} 0.1102(A_s - 8.7) & A_s \geq 50 \text{ dB} \\ 0.5584(A_s - 2.1)^{0.4} + \\ 0.07886(A_s - 21), & 50 \text{ dB} > A_s > 21 \text{ dB} \\ 0, & A_s \leq 21 \text{ dB}. \end{cases} \tag{35}$$

Given $A_s$ and the order of Kaiser window N, the transition bandwidth of the filter $\Delta\omega$ can be calculated as $$\Delta\omega = \frac{7.95 - A_s}{2.285(N-1)}, \tag{36}$$

Taking N=67 as an example, the leakage factor, relative sidelobe attenuation and mainlobe width of Kaiser window spectrum for different $\beta$ are calculated, and the results are exhibited in Table I.

TABLE I

KAISER WINDOW CHARACTERISTICS FOR DIFFERENT PARAMETERS

| $\beta$ | Leakage Factor (%) | Relative sidelobe attenuation (dB) | Mainlobe width ($\pi$) |
|---|---|---|---|
| 1 | 6.61 | −14.7 | 0.025 |
| 5 | 0.02 | −37.2 | 0.039 |
| 10 | 0.00 | −74.1 | 0.053 |

TABLE I-continued

KAISER WINDOW CHARACTERISTICS FOR DIFFERENT PARAMETERS

| $\beta$ | Leakage Factor (%) | Relative sidelobe attenuation (dB) | Mainlobe width ($\pi$) |
|---|---|---|---|
| 15 | 0.00 | −113.8 | 0.063 |
| 20 | 0.00 | −155.1 | 0.072 |

It can be found that when $\beta$ is small, there will be leakage factors in the window spectrum. The larger the $\beta$, the larger the sidelobe attenuation and mainlobe width of the window spectrum. When $\beta$ is sufficiently large, the passband of the designed filter becomes narrower. Thus, Kaiser window can design different frequency responses according to the required stopband attenuation and transition bandwidth.

C. Exemplary Flowchart

Figure 3:
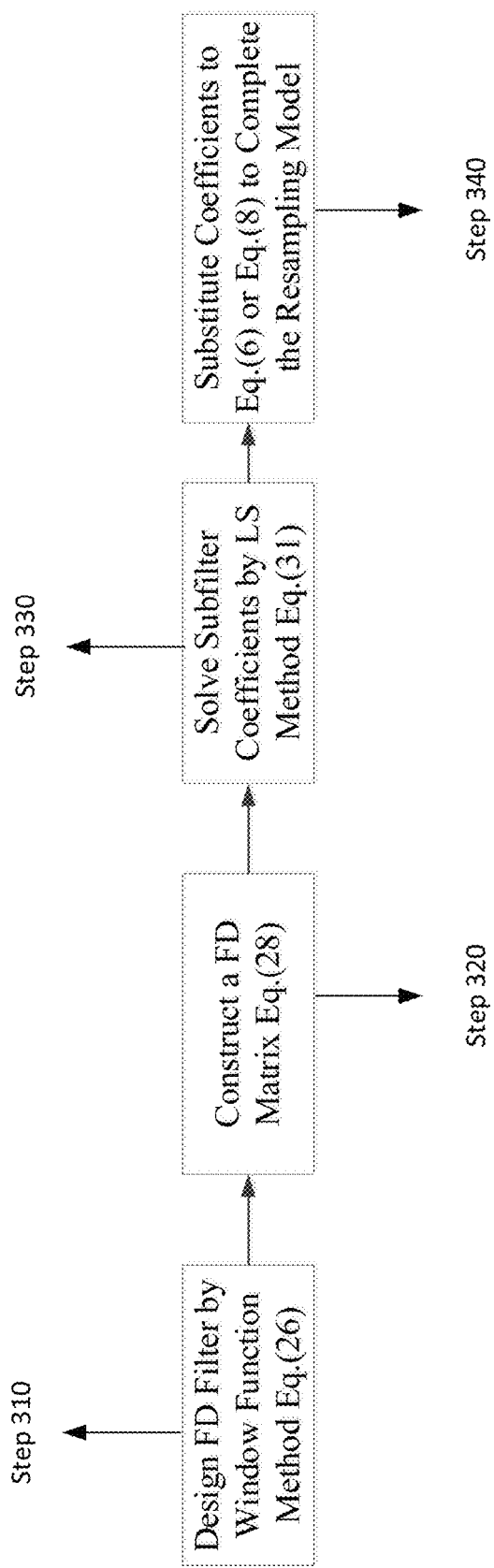
FIG. 3 shows the flowchart of an exemplary resampling algorithm based on window function.

FIG. 3 shows the flowchart of an exemplary resampling algorithm based on window function. In this example, the presented method is simple in operation and the matrix operation is only reflected in least square method.

In step 310, a fractional delay filter design model based on window function is established. In particular, the expression of designing the impulse response of the linear-phase FIR filter via window function method is $$h_l(n) = h_d(n) \cdot w(n), \quad 0 \leq n \leq N-1, \tag{37}$$

where w(n) is a sequence of the window function of length N, Kaiser window is selected in this disclosure, and $h_d(n)$ is the impulse response of the ideal low-pass digital filter. The expression of $h_d(n)$ is $$h_d(n) = \begin{cases} \dfrac{\sin[\omega_c(n-\tau)]}{\pi(n-\tau)}, & n \neq \tau, \\ \dfrac{\omega_c}{\pi} & n = \tau, \end{cases} \tag{38}$$

where $\tau$ and $\omega_c$ are the group delay and the cutoff frequency of the ideal low-pass digital filter. The relationship between $\omega_c$, the passband cutoff frequency $\omega_p$ and the stopband cutoff frequency $\omega_s$ of the designed filter is $$\omega_c = (\omega_p + \omega_s)/2. \tag{39}$$

Thus, $\omega_c$ can indirectly determine $\omega_s$. The group delay $\tau$ of the filter obtained by (24) which can be considered a fractional delay filter without delay, is (N−1)/2. To determine the impulse response $h_p(n)$ of the fractional delay filter, the sequence n is shifted by −p. Equation (24) then becomes $$h_p(n) = h_d(n-p) \cdot w(n-p), \quad 0 \leq n \leq N-1. \tag{40}$$

Equation (27) can be seen as the group delay $\tau$ of $h_l(n)$ shifted by p. Therefore, the group delay of the obtained fractional delay filter is $\tau+p$, and $h_p(n)$ is the impulse response of a fractional delay filter with a delay of p.

In step 320, according to the model, fractional delay filter coefficients with different group delay responses are designed, and a filter coefficients matrix is established. In particular, because the fractional delay filter can be designed in advance, it is much easier to design the subfilter coefficients c(n,i). In the interval [−0.5, 0.5], take multiple values as p as follows:

$$p = -0.5 + b\delta, \quad -0.55 \leq p \leq 0.5, \tag{41}$$

where δ is an interval and b is an integer. Substitute p into (27) to obtain multiple fractional delay filter coefficients. A fractional delay filter coefficients matrix can then be constructed:

$$\begin{bmatrix} h_{p1} \\ h_{p2} \\ \vdots \\ h_{pk} \end{bmatrix} = \begin{bmatrix} h_{p1}(0) & h_{p1}(1) & \ldots & h_{p1}(N-1) \\ h_{p2}(0) & h_{p2}(1) & \ldots & h_{p2}(N-1) \\ \vdots & & & \\ h_{pk}(0) & h_{pk}(1) & \ldots & h_{pk}(N-1) \end{bmatrix}, \quad (42)$$

where $h_{p_k}$ is the filter coefficients whose delay is $p_k$. $h_{p_k} = [h_{p_k}(0), h_{p_k}(1), \ldots, h_{p_k}(N-1)]$.

Next, in step 330, the polynomial form of the filter coefficients matrix is established, and subfilter coefficients are solved by least square method. In particular, by combining (29) and (13), the coefficients matrix can be expressed in polynomial form:

$$\begin{bmatrix} h_{p1} \\ h_{p2} \\ \vdots \\ h_{pk} \end{bmatrix} = \begin{bmatrix} p_1 & p_1^2 & \ldots & p_1^I \\ p_2 & p_2^2 & \ldots & p_2^I \\ \vdots & \vdots & & \vdots \\ p_k & p_k^2 & \ldots & p_k^I \end{bmatrix} \begin{bmatrix} c_{11} & c_{12} & \ldots & c_{1N} \\ c_{21} & c_{22} & \ldots & c_{1N} \\ \vdots & \vdots & & \vdots \\ c_{I1} & c_{I2} & \ldots & c_{IN} \end{bmatrix}. \quad (43)$$

Then (30) can be simply to be $$H = P \square C. \quad (44)$$

Equation (31) can then be used to solve C by least square method as follows:

$$C = (P^T P)^{-1} P^T H. \quad (45)$$

The solution will provide the values for the coefficient matrix.

Next, in step 340, the coefficients solved in step 330 can be used to complete the resampling model. In particular, the coefficients can be substituted in equations (6) or (8). Equation (6) is:

$$y(kT_r) = \sum_{m=-\infty}^{\infty} \sum_{i=0}^{I} x(mT_s) c\left(\left[\frac{kT_r - mT_s}{T_s}\right], i\right) \left(\frac{kT_r}{T_s} - \left[\frac{kT_r}{T_s}\right] - 0.5\right)^i \quad (46)$$

$$= \sum_{m=-\infty}^{\infty} \sum_{i=0}^{I} x(mT_s) c\left(\left[\frac{kT_r - mT_s}{T_s}\right], i\right) (p_k)^i,$$

where $p_k$ is the delay between the input sample and the output sample. As $p_k$ has nothing to do with m, (6) can be simplified to $$y(kT_r) = \sum_{i=0}^{I} \tilde{x}_i(mT_r)(p_k)^i, \quad (47)$$

where $\tilde{x}_i(mT_r)$ is the representation of the sum of $x(mT_s)$ and $c([kT_r - mT_s]/T_s, i])$. Equation (7) can be implemented by the Farrow structure.

Equation (8) is:

$$y(kT_r) = \sum_{m=-\infty}^{\infty} \sum_{i=0}^{I} x(mT_s) c\left(\left[\frac{kT_r - mT_s}{T_r}\right], i\right) \left(-\frac{mT_s}{T_r} - \left[-\frac{mT_s}{T_r}\right] - 0.5\right)^i \quad (48)$$

-continued $$= \sum_{m=-\infty}^{\infty} \sum_{i=0}^{I} x(mT_s) c\left(\left[\frac{kT_r - mT_s}{T_r}\right], i\right) (p_m)^i.$$

As $p_m$ is associated with m, (8) can be simplified to $$y(kT_r) = \sum_{m=-\infty}^{\infty} \sum_{i=0}^{I} \tilde{x}_i(mT_s) c\left(\left[\frac{kT_r - mT_s}{T_r}\right], i\right), \quad (49)$$

where $\tilde{x}_i(mT_s)$ is the representation of the sum of $x(mT_s)$ and $p_m'$. Equation (9) can be implemented by the Transposed Farrow structure. Equations (6) and (8) can both be denoted as the resampling model based on Farrow structure.

Next, the resampling algorithm based on window function can be used by a broadband frequency measurement device to realize different sampling rate conversions, and provide conditions for the measurement of different frequency components. In addition, the proposed algorithm can flexibly adjust the cutoff frequency of the filter and the window function parameter to prevent interference components in the signals.

IV. Simulation and Application

A. Comparison with Existing Optimal Design Methods without Considering Frequency Aliasing Because the characteristics of the filter reflect the applicability of resampling, the VFD filter is designed in this example to reflect the design effect of the presented algorithm. Additionally, the presented algorithm is compared with other algorithms under the same conditions. One such algorithm is called WLS and another is called CG. The parameters are set as N=67, I=7, α=0.9π, β=10.5, $\omega_c$=π and δ=0.05. To evaluate the accuracy of the designed VFD filter, some evaluation criteria need to be defined.

(1) The Normalized Error:

$$\varepsilon_2 = \left(\frac{\int_0^{\alpha\pi} \int_{-0.5}^{0.5} |H_p(\omega, p) - H_d(\omega, p)|^2 dp d\omega}{\int_0^{\alpha\pi} \int_{-0.5}^{0.5} |H_d(\omega, p)|^2 dp d\omega}\right)^{0.5} \times 100\%, \quad (50)$$

$\varepsilon_2$ reflects the overall magnitude error of the filter passband.

(2) The Maximum Magnitude Error:

$$\varepsilon_\infty = 20 \log_{10}(\max \{|H_p(\omega,p) - H_d(\omega,p)|, \omega \in [0,\alpha\pi], p \in [-0.5, 0.5]\}), \quad (51)$$

$\varepsilon_\infty$ reflects the maximum magnitude error of the filter passband.

(3) The Maximum Group-Delay Error:

$$\varepsilon_g = \max \{|\tau(\omega,p) - p|, \omega \in [0,\alpha\pi], p \in [-0.5, 0.5]\}, \quad (52)$$

where p is the group delay of the desired VFD filter and $\varepsilon_g$ reflects the maximum group delay error of the filter passband. Simulation tests based on the evaluation criteria are performed, and the design results of three methods are presented in Table II.

TABLE II

COMPARISON BETWEEN ALGORITHMS

| Method | $\varepsilon_2$(%) | $\varepsilon_\infty$(dB) | $\varepsilon_g$ |
|---|---|---|---|
| WLS | $2.39 \times 10^{-4}$ | −99.20 | $8.90 \times 10^{-4}$ |
| CG | $2.52 \times 10^{-4}$ | −101.54 | $1.36 \times 10^{-3}$ |
| Proposed | $2.25 \times 10^{-4}$ | −97.00 | $2.15 \times 10^{-3}$ |

Figure 4:
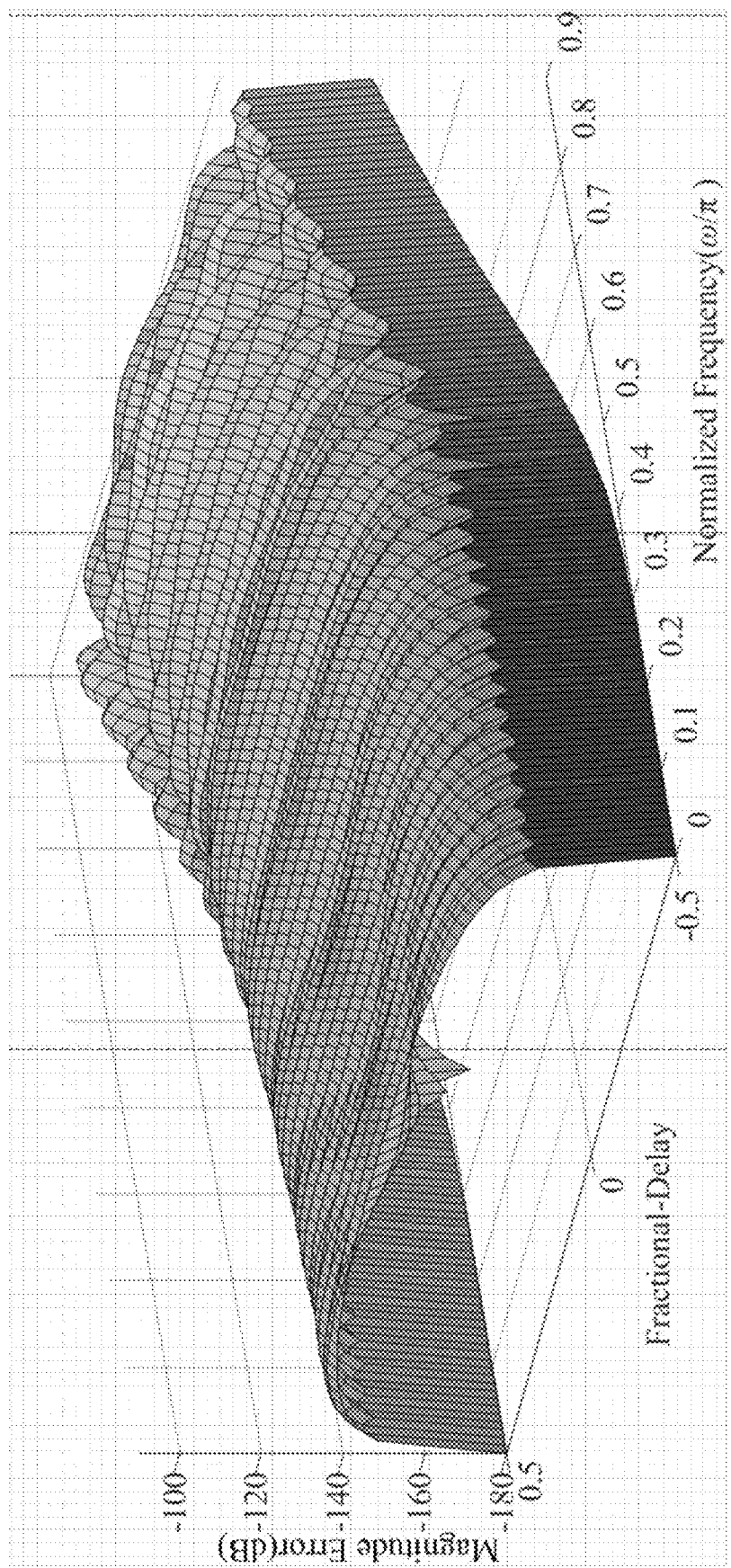
FIG. 4 shows the magnitude error of an exemplary VFD filter.
Figure 5:
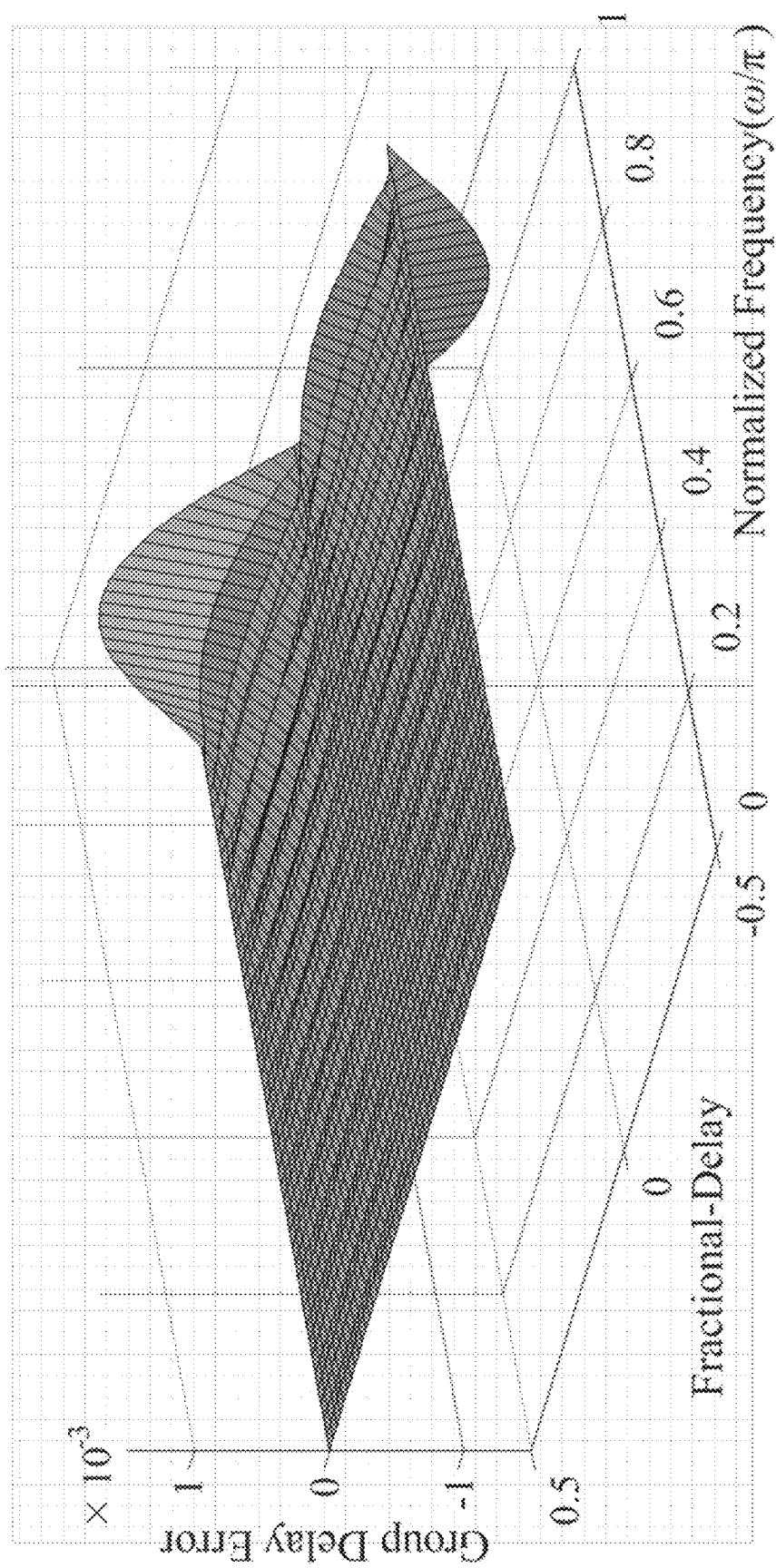
FIG. 5 shows the group delay error of an exemplary VFD filter.

As can be seen from Table II, compared with other methods, the overall magnitude error $\varepsilon_2$ of the presented method is smaller, but the maximum errors $\varepsilon_\infty$ and $\varepsilon_g$ are larger. FIG. 4 shows the magnitude error of an exemplary VFD filter. FIG. 5 shows the group delay error of an exemplary VFD filter.

It is evident from FIGS. 4 and 5 that the designed filter characteristics are good in the low and middle-frequency bands, and the maximum magnitude and group delay error both appear at frequency $\omega=0.9\pi$. Because the maximum magnitude error of the designed filter is −97 dB, the error is close to −100 dB and acceptable. Thus, the method proposed in this paper can be used to design a filter with good performance.

Figure 6:
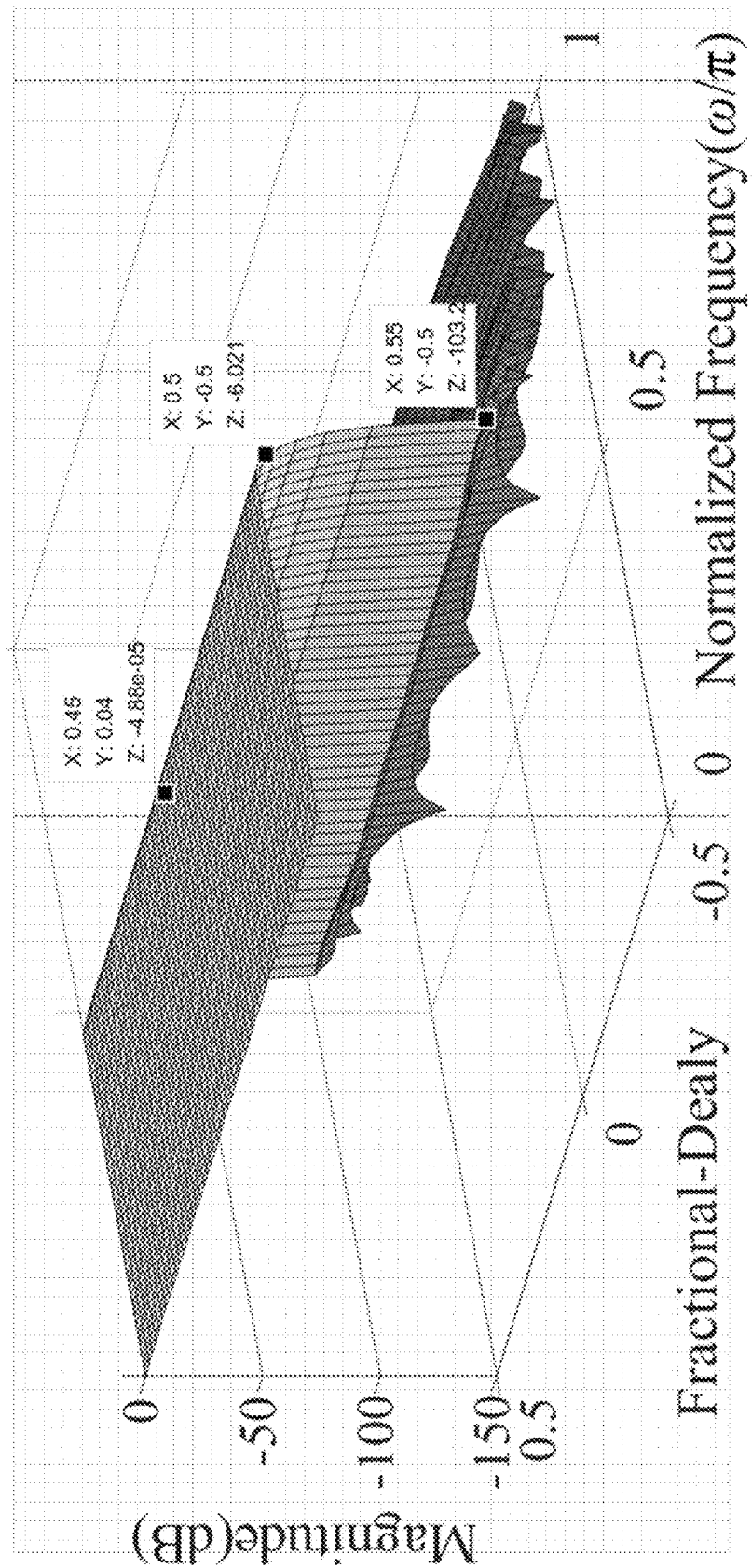
FIG. 6 shows the magnitude responses of the corresponding exemplary VFD filter.

When the designed filter is used in resampling model, it can only be used in the case in which $T_s=T_r$. To reflect the filter characteristics of the resampling model for other $T_r$, take $T_r=2\times T_s$ and according to (12), the filter order becomes 135. FIG. 6 shows the magnitude responses of the corresponding exemplary VFD filter. In FIG. 6, Tr=2×Ts.

It can be seen from FIG. 6 that the passband range of the filter is halved to [0,0.45π]. However, the magnitude is −6.021 dB when $\omega=0.5\pi$, and the stopband cutoff frequency $\varphi_s$ is around 0.55π; therefore, the filter cannot effectively suppress signals with frequency around 0.5π. It can be concluded that resampling by the designed filter in this example cannot satisfy the Nyquist theorem, because the cutoff frequency we is slightly too large.

B. Comparison with Existing Optimal Design Methods Considering Frequency Aliasing Because resampling in example A cannot satisfy the sampling theorem due to the high cutoff frequency, the passband and cutoff frequency of the filter are adjusted in this example, and the VFD filter is redesigned by three algorithms.

In this exemplary simulation, the parameters are set as N=67, I=7, α=0.9π, β=15, $\omega_c$=0.85π and δ=0.05. To reflect the filter stopband attenuation effect, a new evaluation criterion is defined:

$$\varepsilon_s = \max \{20 \log_{10}(|H(\pi,p)|, p \in [-0.5, 0.5])\}, \quad (53)$$

$\varepsilon_s$ reflects the suppression effect of the designed filter on signals near $\omega=\pi$. The comparison results based on the evaluation criteria are presented in Table III.

TABLE III

COMPARISON BETWEEN ALGORITHMS

| Method | $\varepsilon_2$(%) | $\varepsilon_\infty$(dB) | $\varepsilon_g$ | $\varepsilon_s$(dB) |
|---|---|---|---|---|
| WLS | * | * | * | * |
| CG | $6.50 \times 10^{-6}$ | −124.00 | $3.30 \times 10^{-5}$ | −13.31 |
| Proposed | $6.14 \times 10^{-6}$ | −124.69 | $1.78 \times 10^{-6}$ | −153.61 |

*Fails to converge

The simulation results demonstrate that the method based on WLS cannot design the required filter. The reason for this is that when the passband is narrow, the error between the designed filter and the ideal filter is large, resulting in the failure to converge.

Figure 7:
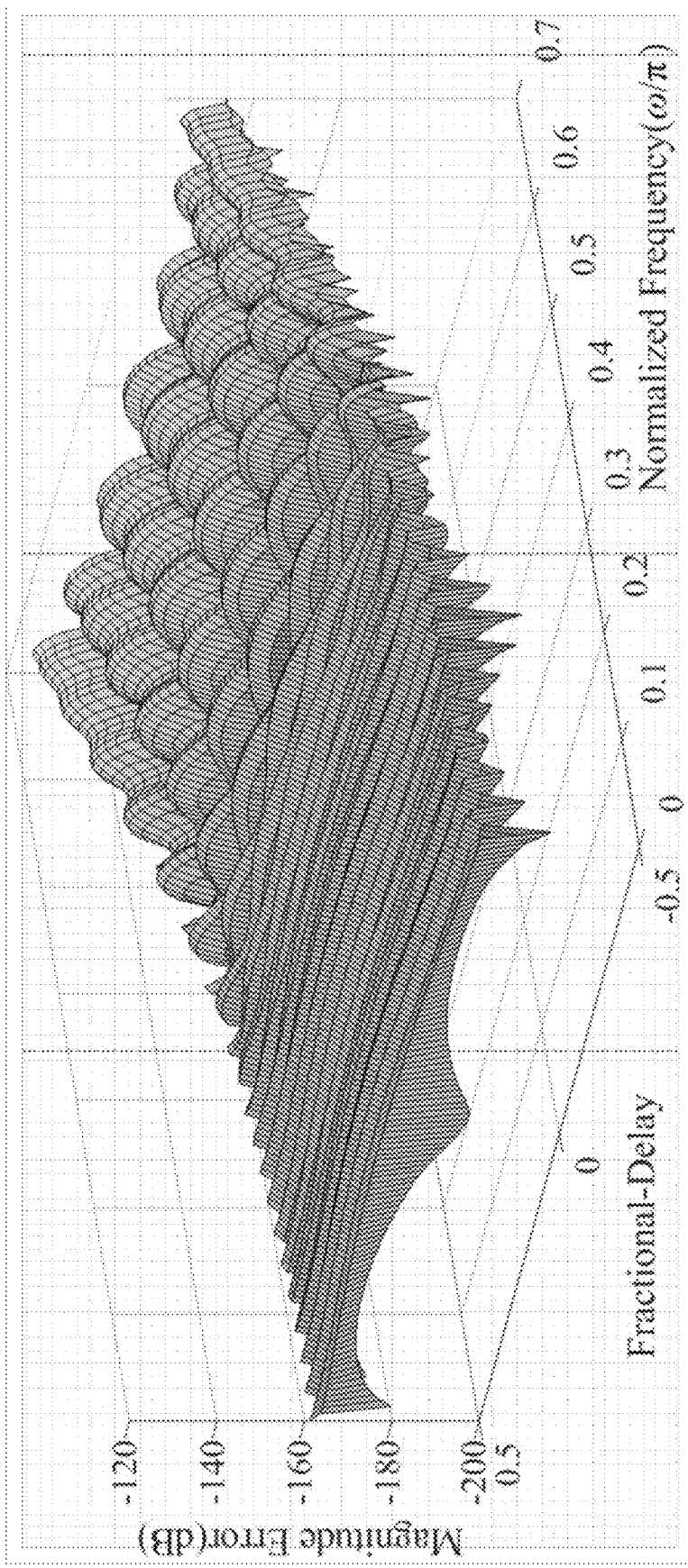
FIG. 7 shows the magnitude error of the designed exemplary VFD filter.
Figure 8:
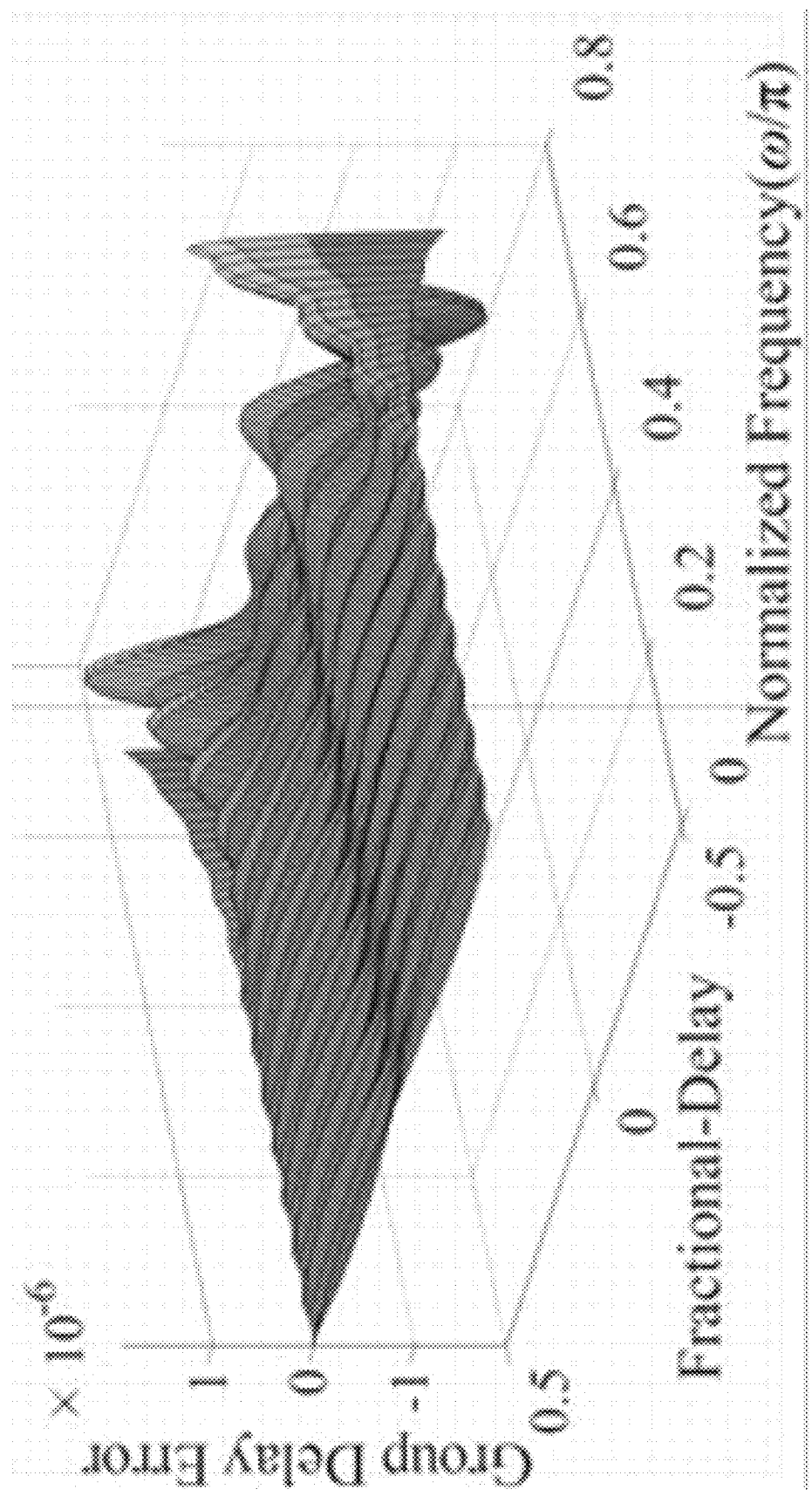
FIG. 8 shows the group delay error of the designed exemplary VFD filter.

By comparing the four evaluation criteria, it can be found that the characteristics of the VFD filter designed by the proposed method are obviously better than those of the filter designed by CG method. $\varepsilon_s$ reveals that CG method cannot effectively suppress signals around $\omega=\pi$. In comparison, the proposed method can effectively control the stopband of the filter and adjust it according to the requirements. FIG. 7 shows the magnitude error of the designed exemplary VFD filter. FIG. 8 shows the group delay error of the designed exemplary VFD filter.

As can be seen from FIGS. 7 and 8, the VFD filter designed by the presented method has a stable error in the passband, and the group delay error is maintained in the order of $10^{-6}$. The maximum magnitude and group delay error both appear at frequency $\omega=0.7\pi$, and the maximum magnitude error of the designed filter is −124.69 dB, which demonstrates that the magnitude error in passband is very small.

Figure 9:
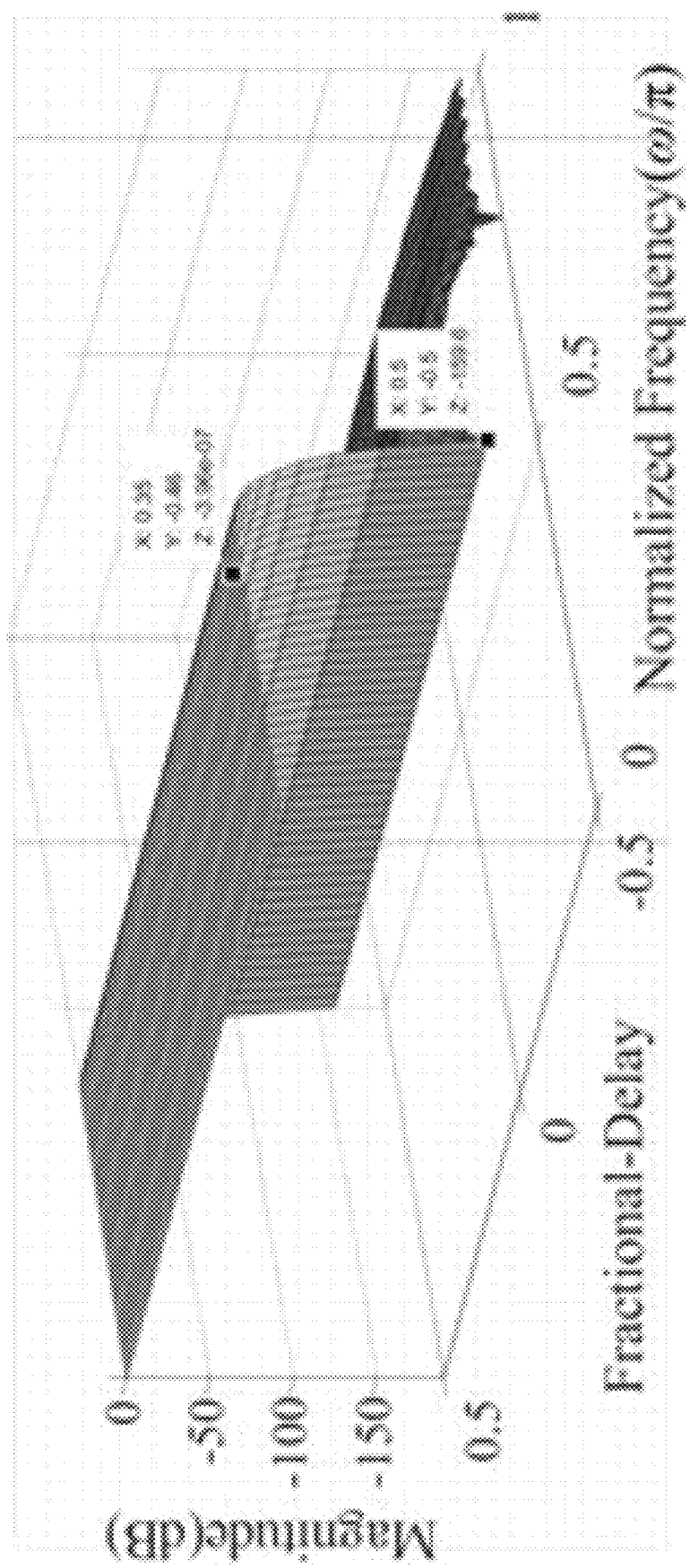
FIG. 9 shows the magnitude responses of the exemplary VFD filter.

FIG. 9 shows the magnitude responses of the exemplary VFD filter when $T_r=2\times T_s$. Like in example A, this reflects the filter characteristics of the resampling model for other $T_r$.

It can be seen from FIG. 9 that the passband range of the filter is halved to [0,0.35π] and the stopband cutoff frequency is around $\omega=0.5\pi$ where the magnitude is about −159.6 dB. Thus, in this example, the designed filter can filter out signals above 0.5π, and resampling can satisfy the Nyquist theorem when $T_r=2\times T_s$.

Therefore, it can be concluded that the proposed method is more adaptable than the traditional optimal method, and the method can flexibly adjust Kaiser window parameter β and cutoff frequency $\omega_c$ to meet the needs of practical applications.

C. Signal Processing with Resampling Model

To verify the effect of the resampling algorithm when applied to the broadband frequency measurement device, this example applies the designed subfilter coefficients in example B to resampling model (8), uses (8) to resample the signal at different sampling rates, and then analyzes the resampling results.

The original signal with harmonic and inter-harmonic components is considered, let $$x(t) = \sqrt{2}[57.73 \cos(100\pi t) + 5.773[\cos(200\pi t) + \cos(6190\pi t)]]. \quad (54)$$

For the original signal x(t), sampling is performed at the sampling rate of $f_s$=50 kHz. The sampling rate is then converted to $f_r$, the resampling values are output by the resampling model, and the amplitudes of different frequency signals are finally analyzed by Fast Fourier Transform. The results are exhibited in Table IV.

TABLE IV

RESULTS OF THE RESAMPLING ALGORITHM AT DIFFERENT SAMPLING RATES

| $f_r$ | Method | 50 Hz (V) | 100 Hz (V) | 2905 Hz (V) | 3095 Hz (V) |
|---|---|---|---|---|---|
| 50 kHz | CG | 57.73 | 5.773 | 0 | 5.773 |
| | Proposed | 57.73 | 5.773 | 0 | 5.773 |
| 10 kHz | CG | 57.73 | 5.773 | 0 | 5.773 |
| | Proposed | 57.73 | 5.773 | 0 | 5.773 |
| 6 kHz | CG | 57.73 | 5.773 | 0.059 | / |
| | Proposed | 57.73 | 5.773 | $1.6 \times 10^{-10}$ | / |

As presented in Table IV, when $f_r=6$ kHz, signals of −2905 Hz and 2905 Hz exist simultaneously in the design results by CG method, resulting in some interference signals after resampling. Compared with CG method, the presented method can effectively suppress the signals around 3000 Hz and prevent the appearance of interference signals. Additionally, the resampling model does not affect the low-frequency signals far away from $f_r/2$, and the filter in the model suppresses the signals near $f_r/2$.

It is also necessary to verify that the resampling has the function of eliminating the deviation of the non-synchronous sampling to achieve synchronous sampling. This example uses the resampling model (8) to sample signals with different delays, and the results are then analyzed.

The original signal with harmonics and delay is considered, let $$x(t) = \sqrt{2}\,[57.73\cos(100\pi(t - (33.5 + p)/f_s)) + \quad (55)$$
$$5.773[\cos(500\pi(t - (33.5 + p)/f_s)) +$$
$$\cos(5000\pi(t - (33.5 + p)/f_s))]],$$

where t−33.5−p is considered the group delay of the fractional delay filter. For the original signal x(t), sampling is performed at the sampling rate of $f_s=f_r=50$ kHz, and the initial phase angles of different frequency signals in the resampling results are analyzed by Fast Fourier Transform. In addition, the indicator pa is used to reflect the phase angle deviation caused by the lack of compensation for p, and the indicators $p_c$ and $p_w$ respectively represent the phase angle error compensated by the resampling models of CG algorithm and the proposed algorithm. The results are presented in Table V.

TABLE V

SAMPLING RESULTS OF THE RESAMPLING ALGORITHM AT DIFFERENT DELAYS

| p | Phase angle error | 50 Hz (°) | 250 Hz (°) | 2500 Hz (°) |
|---|---|---|---|---|
| −0.5 | $p_d$ | 0.18 | 0.9 | 9 |
|  | $p_c$ | $3.4 \times 10^{-7}$ | $1.4 \times 10^{-6}$ | $-1.4 \times 10^{-6}$ |
|  | $p_w$ | $-1.1 \times 10^{-8}$ | $-4.8 \times 10^{-8}$ | $4.5 \times 10^{-8}$ |
| −0.3 | $p_d$ | 0.108 | 0.54 | 5.4 |
|  | $p_c$ | $-2.1 \times 10^{-8}$ | $-8.5 \times 10^{-8}$ | $6.0 \times 10^{-8}$ |
|  | $p_w$ | $-5.7 \times 10^{-8}$ | $-2.4 \times 10^{-7}$ | $2.7 \times 10^{-7}$ |
| 0 | $p_d$ | 0 | 0 | 0 |
|  | $p_c$ | $-6.1 \times 10^{-10}$ | $-6.8 \times 10^{-9}$ | $-6.5 \times 10^{-10}$ |
|  | $p_w$ | $-6.1 \times 10^{-10}$ | $-6.8 \times 10^{-10}$ | $-6.5 \times 10^{-10}$ |
| 0.2 | $p_d$ | −0.072 | −0.36 | −3.6 |
|  | $p_c$ | $1.7 \times 10^{-8}$ | $6.1 \times 10^{-8}$ | $-5.6 \times 10^{-8}$ |
|  | $p_w$ | $4.9 \times 10^{-8}$ | $2.0 \times 10^{-7}$ | $-2.3 \times 10^{-7}$ |
| 0.5 | $p_d$ | −0.18 | −0.9 | −9 |
|  | $p_c$ | $-3.4 \times 10^{-7}$ | $-1.4 \times 10^{-6}$ | $1.4 \times 10^{-6}$ |
|  | $p_w$ | $-9.5 \times 10^{-9}$ | $3.5 \times 10^{-8}$ | $-4.6 \times 10^{-8}$ |

The results in Table V demonstrate that the resampling model can compensate for different delays p. In contrast, the compensation effects of the two methods are similar.

Therefore, the method proposed in this disclosure has sound results in signal processing, and its function meets the conditions for application in broadband frequency measurement device.

V. Conclusion

This disclosure describes a resampling algorithm based on window function, that can provide conditions for different sampling rates required by existing measurement equipment to measure different component signals. The frequency responses of the filter in resampling model are revealed, and the design conditions of the filter are specified. Then a fractional delay filter design model based on window function is established. According to the model, fractional delay filter coefficients with different group delay responses are designed, and a filter coefficients matrix is established. The polynomial form of the filter coefficients matrix is established, and subfilter coefficients are solved by least square method. As verified by simulation tests, the proposed method can flexibly adjust the cutoff frequency of the filter and the window function parameter to prevent frequency aliasing. When the filter passband requirement is small, the presented method has a better effect than the existing methods. In addition, the presented algorithm can meet the requirements for sampling rate conversion and delay compensation, and can be applied to broadband frequency measurement devices.

Technical Implementation of the Server

Figure 10:
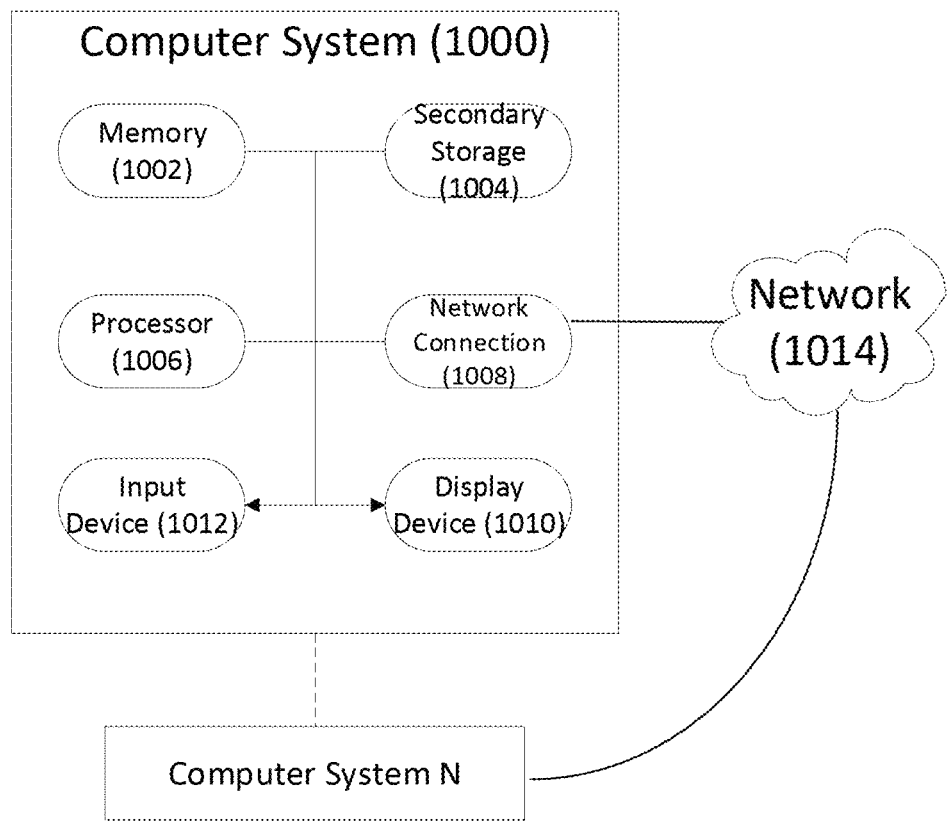
FIG. 10 illustrates exemplary hardware components for a server.

FIG. 10 illustrates exemplary hardware components of a server. A computer system 1000, or other computer systems similarly configured, may include and execute one or more subsystem components to perform functions described herein, including the steps of various flow processes described above. Likewise, a mobile device, a cell phone, a smartphone, a laptop, a desktop, a notebook, a tablet, a wearable device, a server, etc., which includes some of the same components of the computer system 1000, may run an application (or software) and perform the steps and functionalities described above. Computer system 1000 may connect to a network 1014, e.g., Internet, or other network, to receive inquiries, obtain data, and transmit information and incentives as described above.

The computer system 1000 typically includes a memory 1002, a secondary storage device 1004, and a processor 1006. The computer system 1000 may also include a plurality of processors 1006 and be configured as a plurality of, e.g., bladed servers, or other known server configurations. The computer system 1000 may also include a network connection device 1008, a display device 1010, and an input device 1012.

The memory 1002 may include RAM or similar types of memory, and it may store one or more applications for execution by processor 1006. Secondary storage device 1004 may include a hard disk drive, floppy disk drive, CD-ROM drive, or other types of non-volatile data storage. Processor 1006 executes the application(s), such as those described herein, which are stored in memory 1002 or secondary storage 1004, or received from the Internet or other network 1014. The processing by processor 1006 may be implemented in software, such as software modules, for execution by computers or other machines. These applications preferably include instructions executable to perform the system and subsystem component functions and methods described above and illustrated in the FIGS. herein. The applications preferably provide graphical user interfaces (GUIs) through which users may view and interact with subsystem components.

The computer system 1000 may store one or more database structures in the secondary storage 1004, for example, for storing and maintaining the information necessary to perform the above-described functions. Alternatively, such information may be in storage devices separate from these components.

Also, as noted, processor 1006 may execute one or more software applications to provide the functions described in this specification, specifically to execute and perform the steps and functions in the process flows described above. Such processes may be implemented in software, such as software modules, for execution by computers or other machines. The GUIs may be formatted, for example, as web pages in HyperText Markup Language (HTML), Extensible Markup Language (XML) or in any other suitable form for presentation on a display device depending upon applications used by users to interact with the computer system 1000.

The input device 1012 may include any device for entering information into the computer system 1000, such as a touch-screen, keyboard, mouse, cursor-control device, microphone, digital camera, video recorder or camcorder. The input and output device 1012 may be used to enter information into GUIs during performance of the methods described above. The display device 1010 may include any type of device for presenting visual information such as, for example, a computer monitor or flat-screen display (or mobile device screen). The display device 1010 may display the GUIs and/or output from sub-system components (or software).

Examples of the computer system 1000 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 1000 is shown in detail, system 1000 may use multiple computer systems or servers as necessary or desired to support the users and may also use back-up or redundant servers to prevent network downtime in the event of a failure of a particular server. In addition, although computer system 1000 is depicted with various components, one skilled in the art will appreciate that the system can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 1000, to perform a particular method, such as methods described above.

The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

What is claimed is:

1. A resampling method for flexible sampling rate conversion in a broadband frequency measurement device, the method comprising:

revealing frequency responses of a filter in a resampling model;

specifying design conditions of the filter;

completing the resampling model, wherein:

a fractional delay filter design model $h_p(n)$ is an impulse response of a fractional delay filter with a delay of p, and a group delay of an obtained fractional delay filter is $\tau+p$, where $\tau$ is a group delay of an idea low-pass digital filter;

the fractional delay filter design model $h_p(n)$ is expressed as:

$$h_p(n) = h_d(n-p) \cdot w(n-p), \quad 0 \le n \le N-1,$$

wherein $h_d(n)$ is an impulse response of the ideal low-pass digital filter; $h_d(n-p)$ is the impulse response of the ideal low-pass digital filter shifted by a delay p, $w(n)$ is a sequence of a window function of a length N;

fractional delay filter coefficients with different group delay responses are designed by taking multiple values as p being limited as follows:

$$p = -0.5 + b\delta \quad -0.5 \le p \le 0.5,$$

wherein $\delta$ is an interval and b is an integer;

a filter coefficients matrix is established by substituting p into the expressed fractional delay filter design model $h_p(n)$ to obtain multiple fractional delay filter coefficients;

a fractional delay filter coefficients matrix is constructed as follows:

$$\begin{bmatrix} h_{p1} \\ h_{p2} \\ \vdots \\ h_{pk} \end{bmatrix} = \begin{bmatrix} h_{p1}(0) & h_{p1}(1) & \ldots & h_{p1}(N-1) \\ h_{p2}(0) & h_{p2}(1) & \ldots & h_{p2}(N-1) \\ \vdots & & & \\ h_{pk}(0) & h_{pk}(1) & \ldots & h_{pk}(N-1) \end{bmatrix},$$

wherein $h_{pk}$ is the filter coefficients whose delay is $p_k$. $h_{pk} = [h_{pk}(0), h_{pk}(1), \ldots, h_{pk}(N-1)]$;

a polynomial form of the filter coefficients matrix is established, wherein the fractional delay filter coefficients matrix is expressed in polynomial form:

$$\begin{bmatrix} h_{p1} \\ h_{p2} \\ \vdots \\ h_{pk} \end{bmatrix} = \begin{bmatrix} p_1 & p_1^2 & \ldots & p_1^l \\ p_2 & p_2^2 & \ldots & p_2^l \\ \vdots & \vdots & & \vdots \\ p_k & p_k^2 & \ldots & p_k^l \end{bmatrix} \begin{bmatrix} c_{11} & c_{12} & \ldots & c_{1N} \\ c_{21} & c_{22} & \ldots & c_{1N} \\ \vdots & \vdots & & \vdots \\ c_{l1} & c_{l2} & \ldots & c_{lN} \end{bmatrix},$$

subfilter coefficients are solved by least square method in which the following $$H = P \cdot C$$

is used to solve C by least square method as follows:

$$C = (P^T P)^{-1} P^T H,$$

wherein, a solution provides values for the subfilter coefficients;

the values for the subfilter coefficients are used to complete the resampling model by substituting in:

$$y(kT_r) = \sum_{m=-\infty}^{\infty} \sum_{i=0}^{l} x(mT_s) c\left(\left[\frac{kT_r - mT_s}{T_s}\right], i\right) \left(\frac{kT_r}{T_s} - \left[\frac{kT_r}{T_s}\right] - 0.5\right)^i$$

-continued $$= \sum_{m=-\infty}^{\infty} \sum_{i=0}^{I} x(mT_s) c\left(\left[\frac{kT_r - mT_s}{T_s}\right], i\right)(p_k)^i,$$

wherein $x(mT_s)$ is input samples at sampling cycles $T_s$, and $T_r$ is a resampling cycle, $c(n,i)$ is the subfilter coefficient $c_{n,i}$, and [*] indicates the largest integer not exceeding (*); and using the completed resampling model in the broadband frequency measurement device to achieve a predetermined sampling rate conversion and provide conditions for measuring different component signals.

\* \* \* \* \*